United States Patent
Subbarao et al.

(10) Patent No.: US 11,204,721 B2
(45) Date of Patent: Dec. 21, 2021

(54) INPUT/OUTPUT SIZE CONTROL BETWEEN A HOST SYSTEM AND A MEMORY SUB-SYSTEM

(71) Applicant: Micron Technology, Inc., Boise, ID (US)

(72) Inventors: Sanjay Subbarao, Irvine, CA (US); Mark Ish, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/865,247

(22) Filed: May 1, 2020

(65) Prior Publication Data

US 2020/0356307 A1 Nov. 12, 2020

Related U.S. Application Data

(60) Provisional application No. 62/844,067, filed on May 6, 2019.

(51) Int. Cl.
*G06F 3/06* (2006.01)
*G06F 12/1009* (2016.01)
*G11C 16/04* (2006.01)

(52) U.S. Cl.
CPC .......... *G06F 3/0659* (2013.01); *G06F 3/0613* (2013.01); *G06F 3/0679* (2013.01);
(Continued)

(58) Field of Classification Search
CPC .... G06F 3/0613; G06F 3/0659; G06F 3/0679; G06F 12/0246; G06F 12/1009;
(Continued)

(56) References Cited

U.S. PATENT DOCUMENTS

2011/0125955 A1* 5/2011 Chen ................... G06F 12/0246
711/103
2014/0237113 A1 8/2014 Gulati et al.
(Continued)

FOREIGN PATENT DOCUMENTS

WO 2019022631 1/2019

OTHER PUBLICATIONS

Bjørling, Matias,. From Open-Channel SSDs to Zoned Namespaces. Vault '19 Program [online] Jan. 23, 2019, [retrieved on Apr. 22, 2021]. Retrieved from the Internet <URL: https://www.usenix.org/sites/default/files/conference/protected-files/nsdi19_slides_bjorling.pdf> (Year: 2019).*

(Continued)

*Primary Examiner* — Larry T Mackall
(74) *Attorney, Agent, or Firm* — Greenberg Traurig

(57) ABSTRACT

A memory sub-system configured to dynamically determine input/output sizes of write commands based on a media physical layout of a memory sub-system. The memory sub-system can identify, dynamically in response to write commands being selected for execution in media units of the memory sub-system, a portion of a media layout that maps from logical addresses identified by the write commands in the logical address space to physical addresses of memory units in the media units. Based on the media layout, an input/output size for a next write command is identified and transmitted to the host system in a response. The host system generates the next write command and configures the amount of data to be written through the next write command based on the input/output size identified in the response.

20 Claims, 6 Drawing Sheets

(52) U.S. Cl.
CPC ...... *G06F 12/1009* (2013.01); *G11C 16/0483* (2013.01); *G06F 2212/1044* (2013.01)

(58) Field of Classification Search
CPC ..... G06F 2212/1016; G06F 2212/1044; G06F 2212/7201; G06F 2212/7208; G11C 11/5628; G11C 16/0483; G11C 16/10; G11C 2211/5641
See application file for complete search history.

(56) References Cited

U.S. PATENT DOCUMENTS

| | | | |
|---|---|---|---|
| 2015/0058539 A1* | 2/2015 | Huang | G06F 16/2228 711/103 |
| 2015/0212759 A1 | 7/2015 | Jo | |
| 2016/0179678 A1* | 6/2016 | Camp | G06F 12/0855 711/103 |
| 2016/0349992 A1 | 12/2016 | Basak et al. | |
| 2016/0350010 A1 | 12/2016 | Ryan et al. | |
| 2017/0255396 A1* | 9/2017 | Labenski | G06F 3/0613 |
| 2019/0004737 A1* | 1/2019 | Khan | G06F 13/38 |

OTHER PUBLICATIONS

Mellor, Chris,. Zoned SSDs live fast, die old, Western Digital claims. Blocks & Files [online] Mar. 27, 2019, [retrieved on Apr. 22, 2021] . Retrieved from the Internet <URL: https://blocksandfiles.com/2019/03/27/disk-shingling-scheme-driving-zoned-ssd-developments/> (Year: 2019).*
International Search Report and Written Opinion, PCT/US2020/031477, dated Aug. 26, 2020.

* cited by examiner

INPUT/OUTPUT SIZE CONTROL BETWEEN A HOST SYSTEM AND A MEMORY SUB-SYSTEM

RELATED APPLICATION

The present application claims priority to Prov. U.S. Pat. App. Ser. No. 62/844,067, filed May 6, 2019 and entitled "Input/Output Size Control between a Host System and a Memory Sub-System," the entire disclosure of which is hereby incorporated herein by reference.

FIELD OF THE TECHNOLOGY

At least some embodiments disclosed herein relate to memory systems in general, and more particularly, but not limited to the input/output size control between a host system and a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
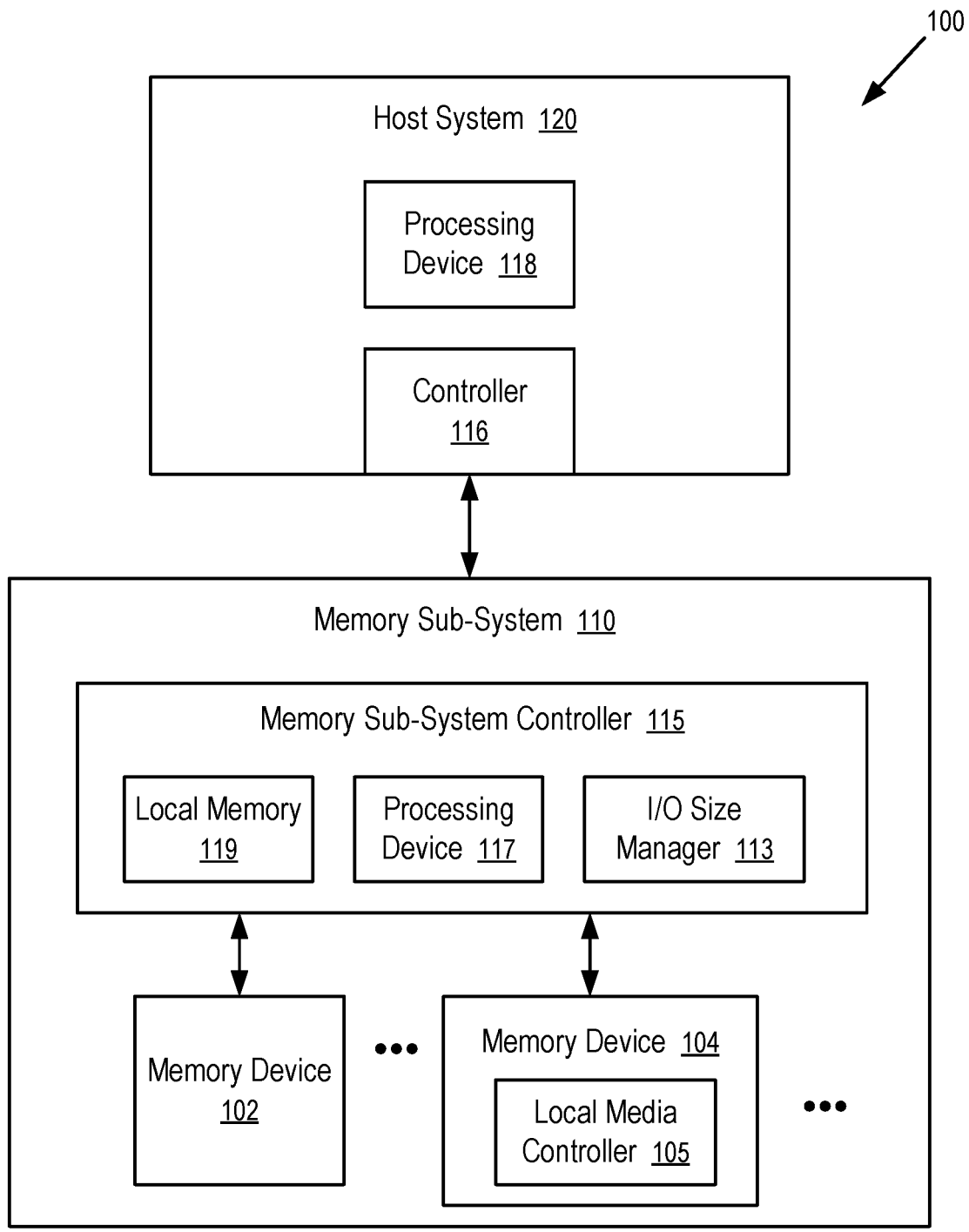
FIG. 1 illustrates an example computing system that includes a memory sub-system in accordance with some embodiments of the present disclosure.

At least some aspects of the present disclosure are directed to input/output size control for a host system to write data into a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Traditionally, the host system can send write commands to the memory sub-system to write data in a fixed, predetermined size or granularity. For example, the data to be stored into the memory sub-system via each write command from the host system is for the same, fixed, predetermined amount/size of data. However, in some situations, the fixed input/output size can lead to significant performance loss, increased lifetime of data being buffered in the memory sub-system, and/or the use of an alternative, less efficient data programming method in the memory sub-system.

At least some aspects of the present disclosure address the above and other deficiencies through a mechanism of input/output size control implemented between the host system and the memory sub-system. For example, based on the current state of a media layout for placing data in the media of the memory sub-system, an input/output size controller can determine a preferred size for input/output for a next write command. The preferred size is equal to the amount of data that the memory sub-system can program into a media unit in a single atomic operation. For example, the memory sub-system can have NAND (negative-and) flash memory. Using a single pass programming technique, an atomic write operation in a NAND device can program/store data into a single plane page, a dual plane page, a quad plane page, or a multi-plane page. Using a multi-pass programming technique, an atomic write operation in a NAND device can program/store data into a page in an SLC (single level cell) mode, a page in an MLC (multi-level cell) mode, a page in a TLC (triple level cell) mode, or a page in a QLC (quad-level cell) mode. A page programmed in an atomic write operation can have different sizes in different modes. For example, an SLC page can have a size of 64 Kilobytes (KB); a TLC page can have a size of 128 KB; and a QLC page can have a size of 64 KB using a multi-pass programming method. When the pages of data of different write streams of different program modes are interleaved in the NAND device, the host system may not be able to predict the size that is suitable for the next write commands in a write stream. The memory sub-system can determine, based on the state of the media layout the preferred input/output size and communicate the size to the host system (e.g., via a status field in a response to a current command). The input/output size provided in the response can be used to configure the next write command. In some instances, when the input/output size of a write command from the host system is not preferred (e.g., does not match with the preferred size for the next write operation), the memory sub-system can communicate an error status with the preferred size to the host system to cause the host system to adjust its write commands to the preferred size.

FIG. 1 illustrates an example computing system 100 that includes a memory sub-system 110 in accordance with some embodiments of the present disclosure. The memory sub-system 110 can include media, such as one or more volatile memory devices (e.g., memory device 102), one or more non-volatile memory devices (e.g., memory device 104), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a Serial Advanced Technology Attachment (SATA) interface, a Peripheral Component Interconnect Express (PCIe) interface, Universal Serial Bus (USB) interface, Fibre Channel, Serial Attached SCSI (SAS), a Double Data Rate (DDR) memory bus, Small Computer System Interface (SCSI), a Dual In-line Memory Module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 104) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 102, 104. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 102, 104 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a Field Programmable Gate Array (FPGA), an Application Specific Integrated Circuit (ASIC), etc.), or another suitable processor.

The memory devices 102, 104 can include any combination of the different types of non-volatile memory components and/or volatile memory components. The volatile memory devices (e.g., memory device 102) can be, but are not limited to, Random Access Memory (RAM), such as Dynamic Random Access Memory (DRAM) and Synchronous Dynamic Random Access Memory (SDRAM).

Some examples of non-volatile memory components include a Negative-AND (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 104 can include one or more arrays of memory cells. One type of memory cell, for example, Single Level Cells (SLCs) can store one bit per cell. Other types of memory cells, such as Multi-Level Cells (MLCs), Triple Level Cells (TLCs), Quad-Level Cells (QLCs), and penta-level cells (PLCs) can store multiple bits per cell. In some embodiments, each of the memory devices 104 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 104 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 104 can be based on any other type of non-volatile memory, such as Read-Only Memory (ROM), Phase Change Memory (PCM), self-selecting memory, other chalcogenide based memories, Ferroelectric Transistor Random-Access Memory (FeTRAM), Ferroelectric Random Access Memory (FeRAM), Magneto Random Access Memory (MRAM), Spin Transfer Torque (STT)-MRAM, Conductive Bridging RAM (CBRAM), Resistive Random Access Memory (RRAM), Oxide based RRAM (OxRAM), Negative-OR (NOR) flash memory, and Electrically Erasable Programmable Read-Only Memory (EEPROM).

A memory sub-system controller 115 (or controller 115 for simplicity) can communicate with the memory devices 104 to perform operations such as reading data, writing data, or erasing data at the memory devices 104 and other such operations (e.g., in response to commands scheduled on a command bus by controller 116). The controller 115 can include hardware such as one or more Integrated Circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a Field Programmable Gate Array (FPGA), an Application Specific Integrated Circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include Read-Only Memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 104. The controller 115 can be responsible for other operations such as wear leveling operations, garbage collection operations, error detection and Error-Correcting Code (ECC) operations, encryption operations, caching operations, and address translations between a logical address (e.g., Logical Block Address (LBA), namespace) and a physical address (e.g., physical block address) that are associated with the memory devices 104. The controller 115 can further include host interface circuitry to communicate with the host system 120 via the physical host interface. The host interface circuitry can convert the commands received from the host system into command instructions to access the memory devices 104 as well as convert responses associated with the memory devices 104 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 104.

In some embodiments, the memory devices 104 include local media controllers 105 that operate in conjunction with memory sub-system controller 115 to execute operations on one or more memory cells of the memory devices 104. An external controller (e.g., memory sub-system controller 115) can externally manage the memory device 104 (e.g., perform media management operations on the memory device 104). In some embodiments, a memory device 104 is a managed memory device, which is a raw memory device combined with a local controller (e.g., local controller 105) for media management within the same memory device package. An example of a managed memory device is a Managed NAND (MNAND) device.

The computing system 100 includes an input/output size manager 113 in the memory sub-system 110 that determines the preferred input/output size for atomically store/program/commit/write data into the media of the memory sub-system 110. In some embodiments, the controller 115 in the memory sub-system 110 includes at least a portion of the input/output size manager 113. In other embodiments, or in combination, the controller 116 and/or the processing device 118 in the host system 120 includes at least a portion of the input/output size manager 113. For example, the controller 115, the controller 116, and/or the processing device 118 can include logic circuitry implementing the input/output size manager 113. For example, the controller 115, or the processing device 118 (processor) of the host system 120, can be configured to execute instructions stored in memory for performing the operations of the input/output size manager 113 described herein. In some embodiments, the input/output size manager 113 is implemented in an integrated circuit chip disposed in the memory sub-system 110. In other embodiments, the input/output size manager 113 is part of an operating system of the host system 120, a device driver, or an application.

The input/output size manager 113 can determine, from a media physical layout of mapping logical addresses in the media units/memory devices 102 to 104, the preferred size for the next write command from the host system. For example, based on whether the next page is to be programmed in an SLC mode, an MLC mode, a TLC mode, or a QLC mode, the input/output size manager 113 can determine the preferred size as 64 KB or 128 KB. In general, there can be many causes for the unevenness of the page size suitable for atomic write operations. The technique disclosed to address the unevenness is not limited to a specific cause of the unevenness of memory pages that are available for atomic write operations. The input/output size manager 113 can provide the preferred size in a response to a completed command to the host system 120. In response, the host system 120 adjusts the size of the next write commands transmitted to the memory sub-system 110. Further details with regards to the operations of the input/output size manager 113 are described below.

Figure 2:
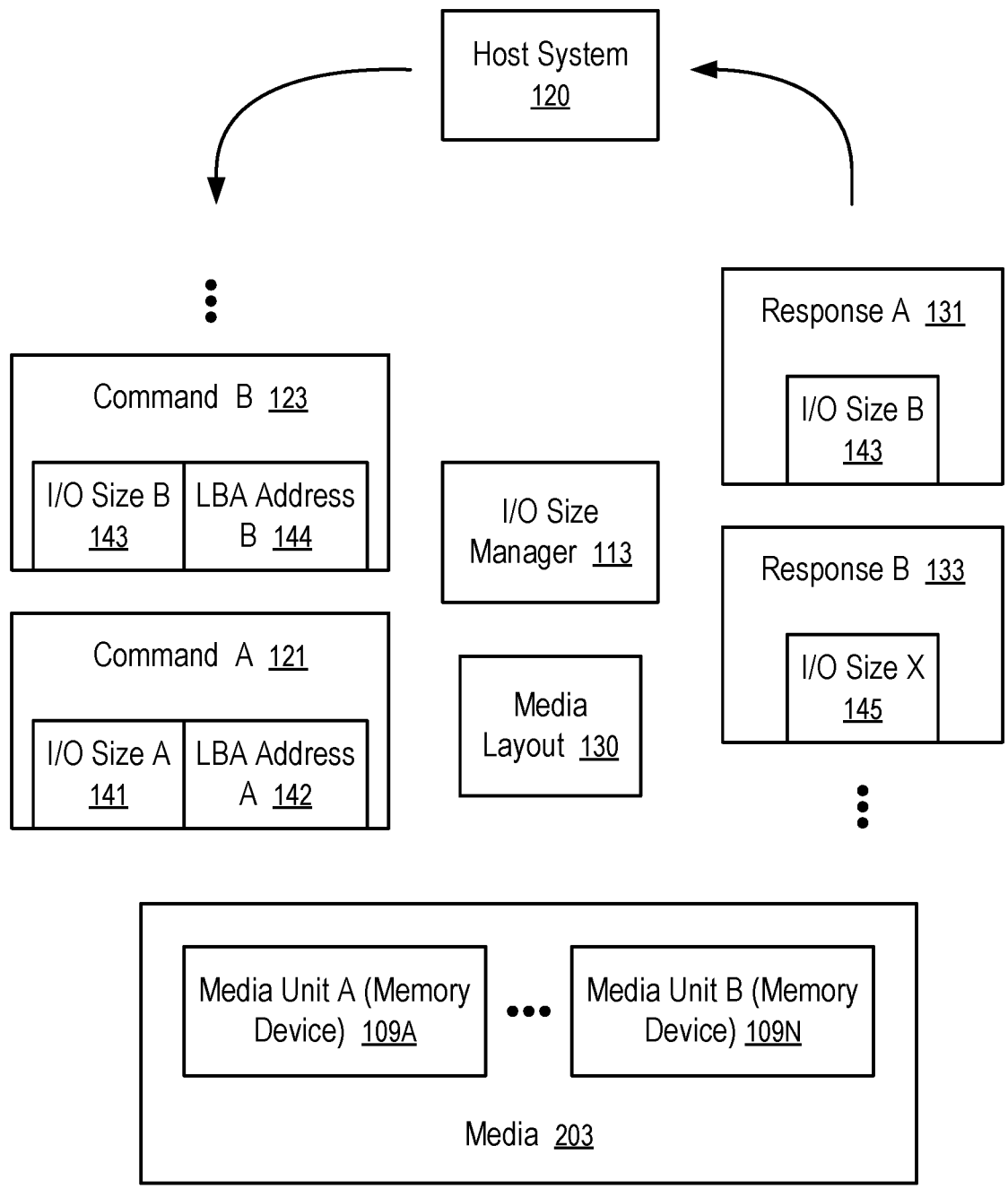
FIG. 2 shows an input/output size manager controlling the granularity of input/output between a host system and a memory sub-system.

FIG. 2 shows an input/output size manager 113 controlling the granularity of input/output between a host system 120 and a memory sub-system 110. For example, the technique of input/output size control of FIG. 2 can be implemented in the computer system 100 of FIG. 1.

In FIG. 2, the host system 120 sends commands 121, 123, . . . , to store data into the media 203 of the memory sub-system 110. The commands (e.g., 121 or 123) includes the sizes (e.g., 141 or 143) of the data to be written into the media 203 and the logical addresses (e.g., 142 or 144) for storing the data in the media 203.

The memory system 110 has a media layout 130 that specifies the mapping between the addresses (e.g., 142 and 144) used in commands (123) received in the memory sub-system 110 from the host system 120 and the physical memory locations in the memory media 203 of the memory sub-system.

In some implementations, the media layout 130 is generated dynamically in response to the write commands from the host system 120. For example, the media 203 can have multiple media units 109A to 109N (e.g., memory devices 102 and/or 104 illustrated in FIG. 1) that are capable of writing data in parallel. At least some of the concurrent streams of write commands from the host system 120 can be executed in the memory sub-system 110 in parallel in committing data into the memory media 203 of the memory sub-system 110. However, one media unit can support one write operation at a time. Thus, if two write commands are mapped by the media layout 130 to operate on a same media unit (e.g., 109A or 109N), an access collision occurs. Each collision increases the time of data being buffered in the memory sub-system before the data can be written into the media 203. To avoid collisions, the media layout 130 can be determined dynamically when the media units (e.g., 109A and 109N) are determined to be available execution of write commands.

For example, the determination of the portion of the media layout for the logical addresses (e.g., 142) used in incoming write commands (e.g., 121) can be postpone until the write commands (e.g., 121) can be executed without collision. When the memory media 203 is configured on integrated circuit dies (e.g., as NAND memory cells), the media layout determination can be based on the identification of integrated circuit dies that are available for performing write operations at the time of input/output scheduling. The media layout 130 is determined such that logical addresses of the commands to be executed in parallel are mapped to different integrated circuit dies that are available for concurrent/parallel operations without collision. Thus, media access collisions among the write commands from different active streams can be completely avoided.

In general, a write stream includes a set of commands to write, trim, overwrite a set of data together as a group. In the group, the data can be written in a logical space sequentially, randomly, or pseudo-sequentially. Preferably, the data in the group is written into an erase block set, where memory cells in the erase block set store data for the stream but not data from other streams. The erase block set can be erased to remove the data of the stream without erasing the data of other streams. In some instances, collisions can occur when the logical addresses of different streams are mapped into a same erase block set where the data of different streams cannot be separately erased. Such collision can also be avoided through the dynamic media layout technique.

Different write streams can be configured to store data in the media 203 in different modes. For example, one write stream may store data in memory cells in the media 203 in an SLC mode or an MLC mode; and another write stream may store data in memory cells in the media 203 in a TLC mode or a QLC mode. As a result, the host system 120 may not be able to predict the preferred size or granularity for configuring the data of write commands.

The memory sub-system 110 has an input/output size manager 113 that is configured to determine a preferred input/output size or granularity for the data of write commands. The input/output size manager 113 is configured to communicate the preferred size to the host system 120 via responses (e.g., 143 or 145) transmitted from the memory subsystem 110 to the host system 120.

For example, after the execution/processing of the command 121, the response 131 is transmitted from the memory sub-system 110 to the host system 120. The response 131 is configured to include a preferred size 143 for the next command 123. After receiving the response 131, the host system 120 can configure the next command 123 to have the preferred size 143. After the execution/processing of the command 123, the input/output size manager 113 can provide the preferred size 145 for the next command in the response 133 transmitted from the memory sub-system 110 to the host system 120 for the command 123.

In some implementations, when a command (e.g., 121) received in the memory sub-system 110 has an input/output size (e.g., 141) that is different from the preferred size (e.g., 143) determined from the media layout 130, the input/output size manager 113 can generate the response (e.g., 131) for the command (e.g., 121) that indicates an error in the input/output size of the command (e.g., 121) and provides the correct input/output size (e.g., 143). In view of the response (e.g., 131), the host system 120 can revise the command (e.g., 121) and generate a replacement command (e.g., 123) having the correct size (e.g., 143).

In an alternative implementation, the memory sub-system 110 can execute the command (e.g., 121) having the non-preferred size (e.g., with reduced performance and/or prolonged buffer time for the data of the command 121). The response (e.g., 131) allows the host system 120 to correct the input/output size for the subsequent commands (e.g., 123).

Figure 3:
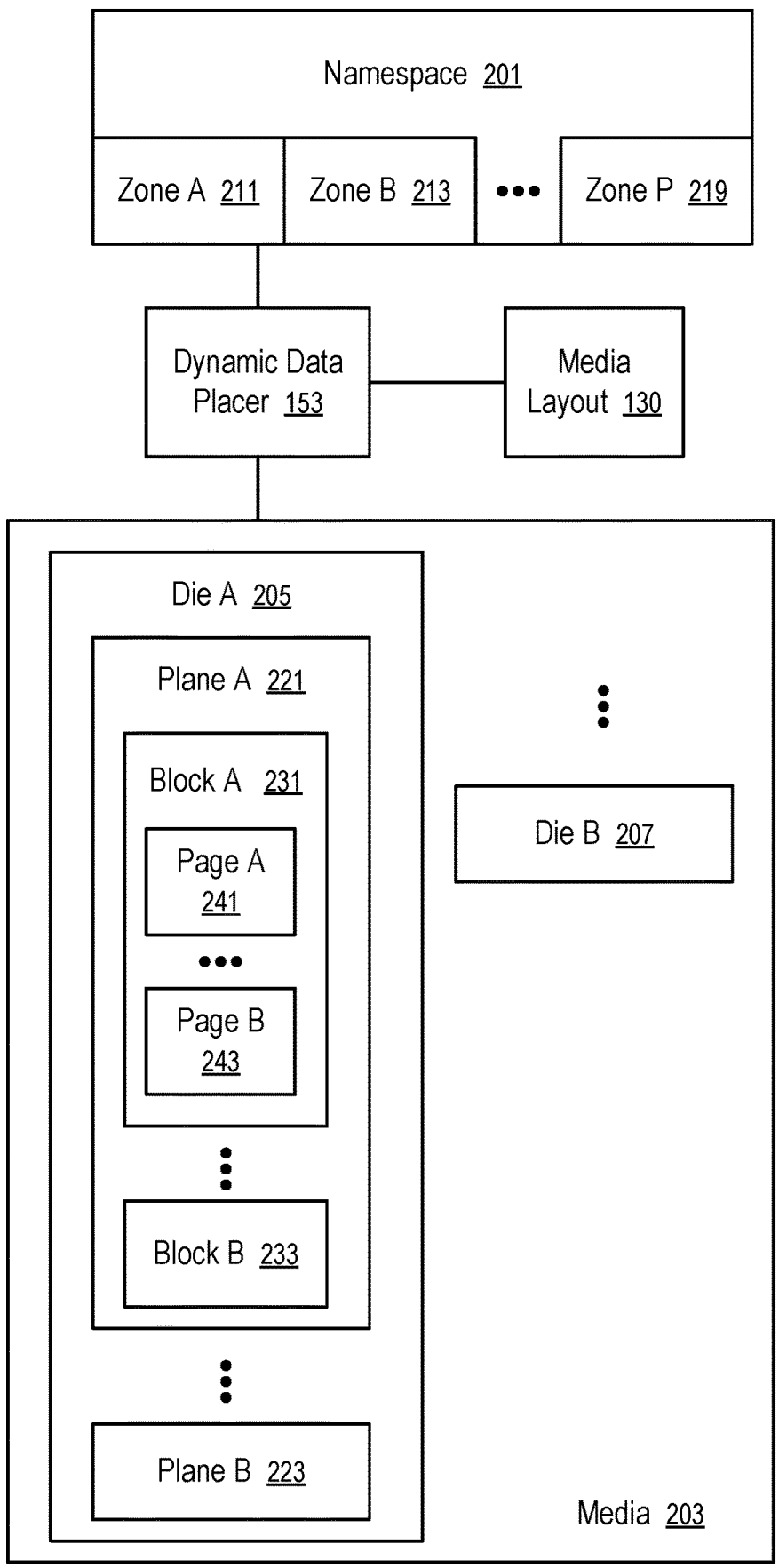
FIG. 3 shows an example of a memory sub-system having dynamic data placement and input/output size control.

FIG. 3 shows an example of a memory sub-system having dynamic data placement and input/output size control. For example, the memory sub-system of FIG. 3 can be implemented in the memory sub-system 110 of FIG. 1 using an input/output size manager 113 of FIG. 2. However, the techniques of FIG. 1 and FIG. 2 are not limited to the implementation of the memory sub-system illustrated in FIG. 3. For example, the techniques of collision avoidance can be implemented in a plain block device, a device that supports namespaces, or a device that supports zoned names spaces (e.g., a memory sub-system illustrated in FIG. 3). Thus, the disclosure presented herein is not limited to the example of FIG. 3.

In FIG. 3, a namespace 201 is configured on the media storage capacity of the memory sub-system 110. The namespace 201 provides a logical block addressing space that can be used by the host system 120 to specify memory locations for read or write operations. The namespace 201 can be allocated on a portion of the media storage capacity of the memory sub-system 110, or the entire media storage capacity of the memory sub-system 110. In some instances, multiple namespaces can be allocated on separate, non-overlapping portions of the media storage capacity of the memory sub-system 110.

In FIG. 3, the namespace 201 is configured with a plurality of zones 211, 213, . . . , 219. Each zone (e.g., 211) in the namespace allows random read access to LBA addresses in the zone (e.g., 211) and sequential write access to LBA addresses in the zone (e.g., 211), but does not allow random write access to random LBA addresses in the zone (211). Thus, writing data into a zone (e.g., 211) is performed in a predetermined, sequential order in the LBA address space of the namespace 201.

When a zone (e.g., 211) in the namespace 201 is configured, it is possible to predetermine the media layout for the zone (e.g., 211) (e.g., for simplicity). The LBA addresses in the zone (e.g., 211) can be pre-mapped to the media 203 of the memory sub-system 110. However, such a predetermined media layout can cause media access collisions when there are multiple parallel write streams, as discussed above. Randomize the mapping from LBA addresses in the zone (e.g., 211) to memory locations in the media 203 can reduce collisions but cannot eliminate collisions.

Preferably, the dynamic data placer 153 is configured in the memory sub-system 110 to create portions of the media layout 130 at the time of the scheduling of write commands for execution such that collisions are complete eliminated. In some implementations, the dynamic data placer 153 is part of the input/output size manager 113.

For example, the media 203 of the memory sub-system 110 can have multiple integrated circuit dies 205, ..., 207. Each of the integrated circuit dies (e.g., 205) can have multiple planes 221, ..., 223 of memory units (e.g., NAND memory cells). Each of the planes (e.g., 221) can have multiple blocks 231, ..., 233 of memory units (e.g., NAND memory cells). Each of the blocks (e.g., 231) can have multiple pages 241, ..., 243 of memory units (e.g., NAND memory cells). The memory units in each page (e.g., 241) is configured to be programmed to store/write/commit data together in an atomic operation; and the memory units in each block (e.g., 231) is configured to be erased data together in an atomic operation.

When a write command (e.g., 121) for storing data in one zone (e.g., 211) and another write command (e.g., 123) for storing data in another zone (e.g., 213) are scheduled for parallel execution as a result of two integrated circuit dies (e.g., 205 and 207) are available for concurrent operations, the dynamic data placer 153 maps the LBA addresses (e.g., 131 and 133) of the write commands (e.g., 121 and 123) into pages located in the different dies (e.g., 205 and 207). Thus, media access collisions can be avoided.

Figure 4:
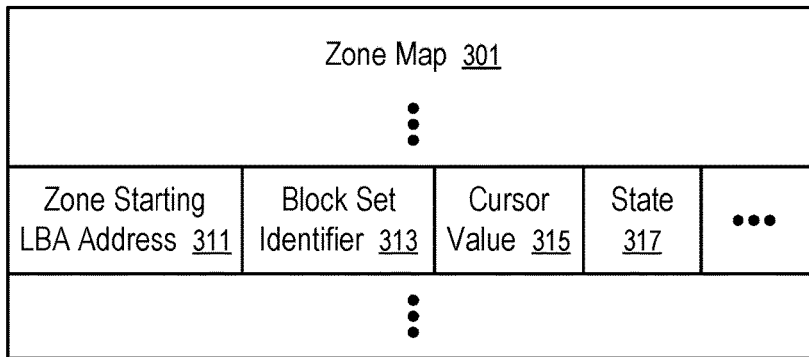
FIG. 4 illustrates an example of data structures configured to support dynamic data placement and input/output size control.
Figure 4:
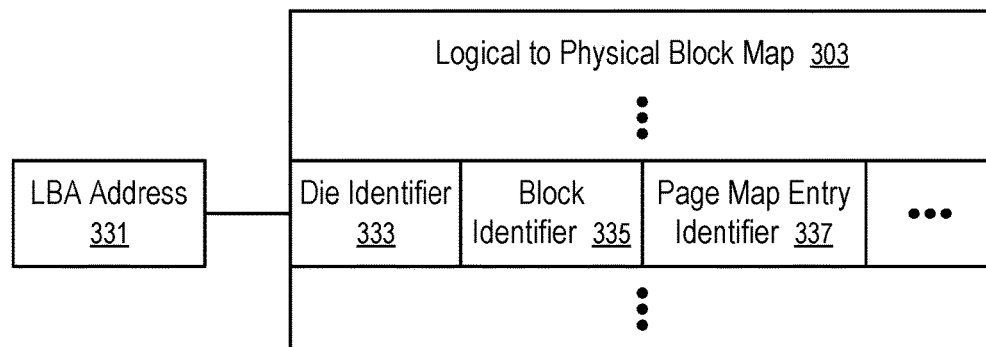
Figure 4:
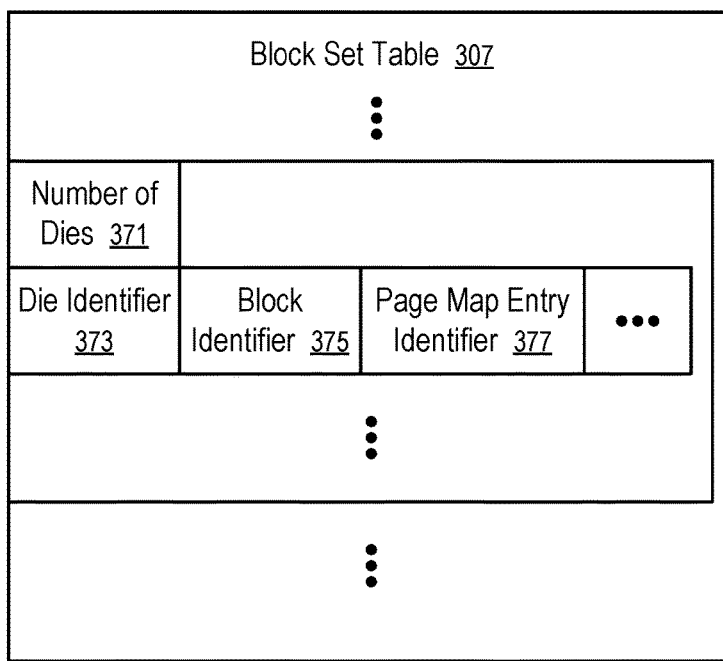
Figure 4:
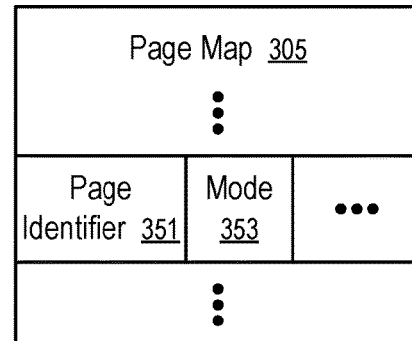

FIG. 4 illustrates an example of data structures configured to support dynamic data placement and input/output size control. For example, the media layout 130 of FIG. 2 or 3 can be implemented using the data structures of FIG. 4.

In FIG. 4, a zone map 301 is configured to provide media layout information for a zone (e.g., 211) in a namespace (e.g., 201). The zone map 301 can have multiple entries. Each entry in the zone map 301 identifies information about a zone (e.g., 211), such as a starting LBA address 311 of the zone (e.g., 211), a block set identifier 313 of the zone (e.g., 211), a cursor value 315 of the zone (e.g., 211), a state 317 of the zone (e.g., 211), etc.

The host system 120 writes data in the zone (e.g., 211) starting at the zone starting LBA address 311. The host system 120 writes data in the zone (e.g., 211) sequentially in the LBA space. After an amount of data has been written into the zone (e.g., 211), the current starting LBA address for writing subsequent data is identified by the cursor value 315. Each write command for the zone moves the cursor value 315 to a new starting LBA address for the next write command for the zone. The state 317 can have a value indicating that the zone (e.g., 211) is empty, full, implicitly open, explicitly open, closed, etc.

In FIG. 4, a logical to physical block map 303 is configured to facilitate the translation of LBA addresses (e.g., 331) into physical addresses in the media (e.g., 203).

The logical to physical block map 303 can have multiple entries. An LBA address (e.g., 331) can be used as, or converted into, an index for an entry in the logical to physical block map 303. The index can be used to look up an entry for the LBA address (e.g., 331). Each entry in the logical to physical block map 303 identifies, for an LBA address (e.g., 331), the physical address of a block of memory in the media (e.g., 203). For example, the physical address of the block of memory in the media (e.g., 203) can include a die identifier 333, a block identifier 335, a page map entry identifier 337, etc.

A die identifier 333 identifies a specific integrated circuit die (e.g., 205 or 207) in the media 203 of the memory sub-system 110.

A block identifier 335 identifies a specific block of memory (e.g., NAND flash memory) within the integrated circuit die (e.g., 205 or 207) that is identified using the die identifier 333.

A page map entry identifier 337 identifies an entry in a page map 305.

The page map 305 can have multiple entries. Each entry in the page map 305 can include a page identifier 351 that identifies a page of memory cells within a block of memory cells (e.g., NAND memory cells). For example, the page identifier 351 can include a word line number for the page and a sub block number for the page in the block of NAND memory cells. Further, the entry for the page can include a programming mode 353 of the page. For example, the page can be programmed in an SLC mode, an MLC mode, a TLC mode, or a QLC mode. When configured in the SLC mode, each memory cell in the page is to store one bit of data. When configured in the MLC mode, each memory cell in the page is to store two bits of data. When configured in the TLC mode, each memory cell in the page is to store three bits of data. When configured in the QLC mode, each memory cell in the page is to store four bits of data. Different pages in an integrated circuit die (e.g., 205 or 207) can have different modes for data programming.

In FIG. 4, the block set table 307 stores data controlling aspects of the dynamic media layout for a zone (e.g., 211).

The block set table 307 can have multiple entries. Each entry in the block set table 307 identifies a number/count 371 of integrated circuit dies (e.g., 205 and 207) in which data of the zone (e.g., 211) is stored. For each of the integrated circuit dies (e.g., 205 and 207) used for the zone (e.g., 211), the entry of the block set table 307 has a die identifier 373, a block identifier 375, a page map entry identifier 377, etc.

The die identifier 373 identifies a specific integrated circuit die (e.g., 205 or 207) in the media 203 of the memory sub-system 110, on which die (e.g., 205 or 207) subsequent data of the zone (e.g., 211) can be stored.

The block identifier 375 identifies a specific block (e.g., 231 or 233) of memory (e.g., NAND flash memory) within the integrated circuit die (e.g., 205 or 207) that is identified using the die identifier 373, in which block (e.g., 231 or 233) the subsequent data of the zone (e.g., 211) can be stored.

The page map entry identifier 337 identifies an entry in the page map 305, which identifies a page (e.g., 241 or 241) that can be used to store the subsequent data of the zone (e.g., 211).

Figure 5:
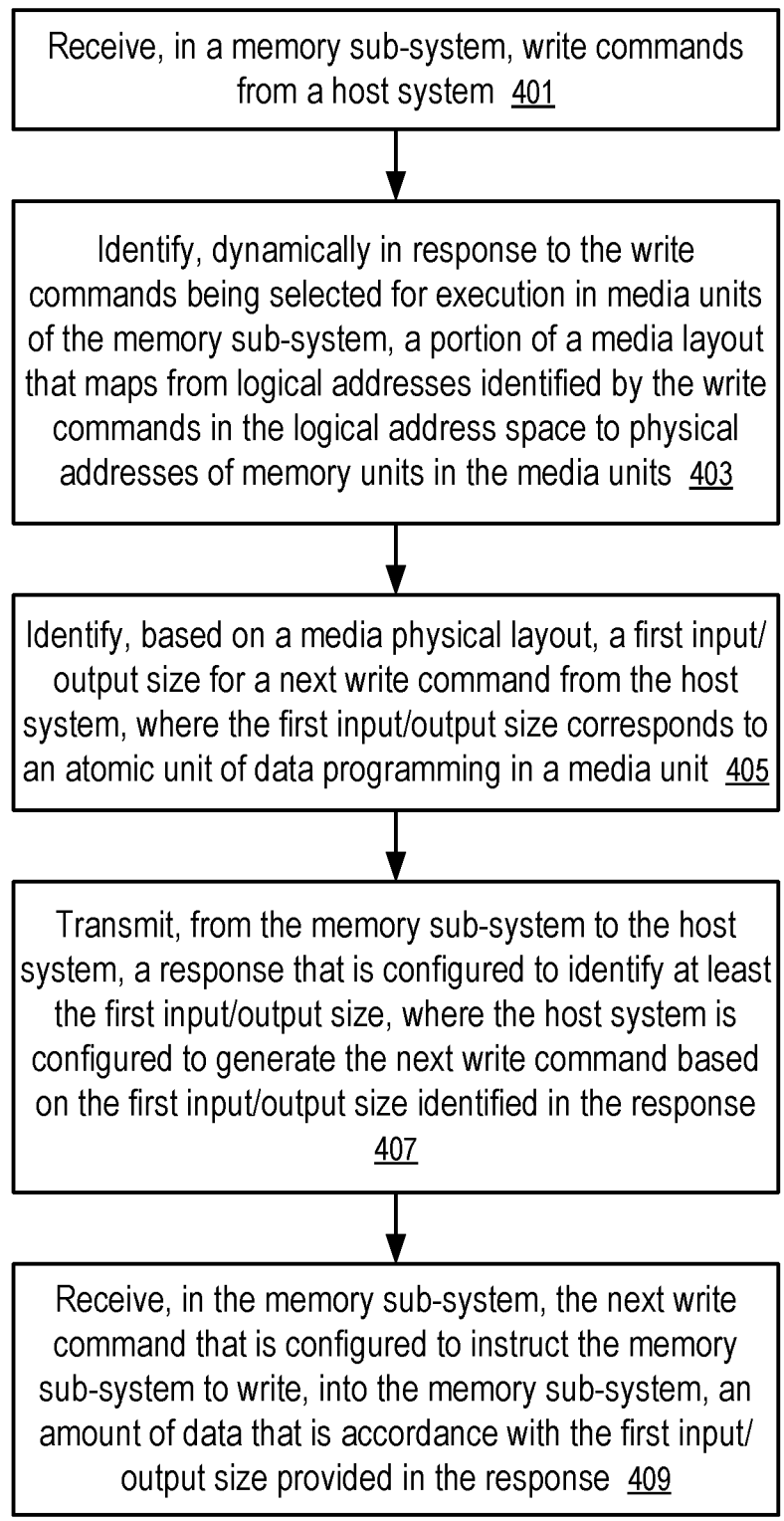
FIG. 5 shows a method of input/output size control.

FIG. 5 shows a method of input/output size control. The method of FIG. 5 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 5 is performed at least in part by the input/output size manager 113 of FIG. 1, or 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 401, a memory sub-system 110 receives write commands from a host system 120. For example, the write commands can be received in multiple write streams. For example, each respective stream in the multiple streams is configured to write data sequentially in a logical address space in one embodiment; and in another embodiment, a stream in the multiple streams is configured to write data pseudo-sequentially, or randomly in a logical address space in one embodiment. Each write stream includes a set of commands that are tagged to write, trim, overwrite a set of data together as a group. In the group, the data can be written in a logical space sequentially, randomly, or pseudo-sequentially. Preferably, the data in the group is written into an erase block set, where memory cells in the erase block set store data for the stream but not data from other streams. The erase block set can be erased to remove the data of the stream without erasing the data of other streams.

For example, the write commands can be provided in multiple write streams. Each of write streams is permitted to sequentially write at LBA addresses in a zone (e.g., 211) in a namespace (e.g., 201) allocated on a media 203 of the memory sub-system 110, but prohibited from writing data out of sequence in the LBA address space.

At block 403, the memory sub-system 110 identifies, dynamically in response to the write commands being selected for execution in media units 109A to 109N of the memory sub-system 110, a portion of a media layout 130 that maps from logical addresses identified by the write commands in the logical address space to physical addresses of memory units in the media units 109A to 109N. For example, the portion of the media layout 130 can be dynamically identified in one embodiment, which can cause unevenness in page sizes for atomic data programming. In other embodiments, the unevenness can be caused by structures and/or data programming schemes and/or sequences in an integrated circuit die.

At block 405, the input/output size manager 113 identifies, based on a media physical layout (e.g., page map 305), a first input/output size (e.g., 143) for a next write command (e.g., 123) from the host system 120, where the first input/output size corresponds to an atomic unit of data programming in a media unit.

At block 407, the memory sub-system 110 transmits, to the host system 120, a response (e.g., 131) that is configured to identify at least the first input/output size (e.g., 143). The host system 120 is configured to generate the next write command (e.g., 123) based on the first input/output size (e.g., 143) identified in the response.

At block 409, the memory sub-system 110 receives the next write command (e.g., 123) that is configured to instruct the memory sub-system to write, into the memory sub-system, an amount of data that is in accordance with the first input/output size (e.g., 143) provided in the response (e.g., 131).

For example, the response (e.g., 131) is configured to include a status of a first write command (e.g., 121) processed in the memory sub-system 110. If the input/output size manager 113 determines that the first write command (e.g., 121) has a second input/output size that is different from the first input/output size (e.g., 143). The input/output size manager 113 can be configured to the response (e.g., 131) to indicate that the second input/output size (e.g., 141) is incorrect, which can cause the host system 120 to transmit the next write command (e.g., 123) to replace the first write command (e.g., 121). Optionally, the memory sub-system 110 can execute the first write command (e.g., 121) in a non-optimal way and send the response (e.g., 131) to indicate the completion of the execution of the first write command (e.g., 121) and provide the preferred size (e.g., 143) in the response (e.g., 131) to cause the host system 120 to size the write commands (e.g., 123) for subsequent data according to the preferred size (e.g., 143).

The preferred input/output size (e.g., 143) can be determined, based on the media layout 130, to be a size of data that is writable into one of the media units 109A to 109N in an atomic write operation. A group of memory cells are atomically programmable when the memory cells cannot be programmed separately. For example, when a memory cell in a page (e.g., 241) of memory cells is programmed in an atomic write operation, the atomic write operation programs all of the memory cells in the page (e.g., 241). Thus, the preferred size of input/output is the size of data that can be stored into the entire set of atomically programmable memory cells in the page (e.g., 241). When a write command has an input/output size that is smaller than the preferred size, the storage capacity of the entire set of atomically programmable memory cells in the page (e.g., 241) is not fully utilized for the write operating. When a write command has an input/output size that is larger than the preferred size, the data of the write command is to be programmed via multiple atomic write operations. Thus, some of the data of the write command may have to be buffered for a longer period of time in order to wait for the next atomic write operation.

In some instances, the page (e.g., 241) of memory cells is a multi-plane page that can be programmed in different modes using a multi-pass programming technique. For example, when in a single level cell (SLC) mode, each memory cell in the page is programmed to store a single bit of data; when in a multi-level cell (MLC) mode, each memory cell in the page is programmed to store two bits of data; when in a triple level cell (TLC) mode, each memory cell in the page is programmed to store three bits of data; and when in a quad-level cell (QLC) mode, each memory cell in the page is programmed to store four bits of data. Thus, the next available multi-plane page can have different capacities for accepting/storing data for programming modes. The input/output size manager 113 can determine the preferred size from the programming mode information (e.g., 353) in the page map 305 illustrated in FIG. 4.

In some instances, different memory units can each have an available page. The different available pages in the different memory units can have different programming modes and thus different sizes. The input/output size manager 113 can select the smallest size of next available memory pages as the preferred size (e.g., 143 or 145) that is communicated to the host system 120. The reduced preferred size provide the host system 120 with an opportunity to construct a write stream at a smallest possible size.

For example, at the time of scheduling the first commands for execution, execution second commands can be in progress in a subset of memory units of the media of the memory sub-system 110. Thus, the subset of memory units used for the execution of the second commands are not available for the first commands. After the first commands are scheduled and the portion of the media layout for the logical addresses used in the first commands is determined, the first commands can be executed in the multiple media units concurrently and/or concurrently with the progress of the execution of the second commands in remaining media units of the memory sub-system 110.

For example, after the identification of the multiple memory units (e.g., integrate circuit dies) that are available for the execution of next commands, the input/output size manager 113 can identify, from the block set table 307, the physical addresses that can be used to store data of the next commands. The physical addresses can be used to update the corresponding entries in the logical to physical block map 303 for the LBA addresses used in the next commands.

For example, when an integrated circuit die (e.g., 205) is free to write data, the input/output size manager 113 can determine a command of a zone that can be written/programmed into the memory cells in the integrated circuit die (e.g., 205). From the block set table 307, the input/output size manager 113 locates an entry for the zone (e.g., 205), locate the block identifier 375 and the page map entry identifier 377 associated with the identifier 373 of the integrated circuit die (e.g., 205), and use the die identifier 373, the block identifier 375, and the page map entry identifier 377 to update the corresponding fields of the entry in the logical to physical block map 303 for the LBA address 331 used in the command of the zone (e.g., 211). Thus, the command of the zone (e.g., 211) can be executed without media access collision for the LBA address 331.

In some implementations, a communication channel between the processing device 118 and a memory sub-system 110 includes a computer network, such as a local area network, a wireless local area network, a wireless personal area network, a cellular communications network, a broadband high-speed always-connected wireless communication connection (e.g., a current or future generation of mobile network link); and the processing device 118 and the memory sub-system can be configured to communicate with each other using data storage management and usage commands similar to those in NVMe protocol.

A memory sub-system 110 in general can have non-volatile storage media. Examples of non-volatile storage media include memory cells formed in an integrated circuit and magnetic material coated on rigid disks. Non-volatile storage media can maintain the data/information stored therein without consuming power. Memory cells can be implemented using various memory/storage technologies, such as NAND logic gate, NOR logic gate, Phase-Change Memory (PCM), Magnetic Random Access Memory (MRAM), resistive random-access memory, cross point storage and memory devices (e.g., 3D XPoint memory). A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

The controller (e.g., 115) of a memory sub-system (e.g., 110) can run firmware to perform operations responsive to the communications from the processing device 118. Firmware in general is a type of computer program that provides control, monitoring and data manipulation of engineered computing devices.

Some embodiments involving the operation of the controller 115 can be implemented using computer instructions executed by the controller 115, such as the firmware of the controller 115. In some instances, hardware circuits can be used to implement at least some of the functions. The firmware can be initially stored in the non-volatile storage media, or another non-volatile device, and loaded into the volatile DRAM and/or the in-processor cache memory for execution by the controller 115.

A non-transitory computer storage medium can be used to store instructions of the firmware of a memory sub-system (e.g., 110). When the instructions are executed by the controller 115 and/or the processing device 117, the instructions cause the controller 115 and/or the processing device 117 to perform a method discussed above.

Figure 6:
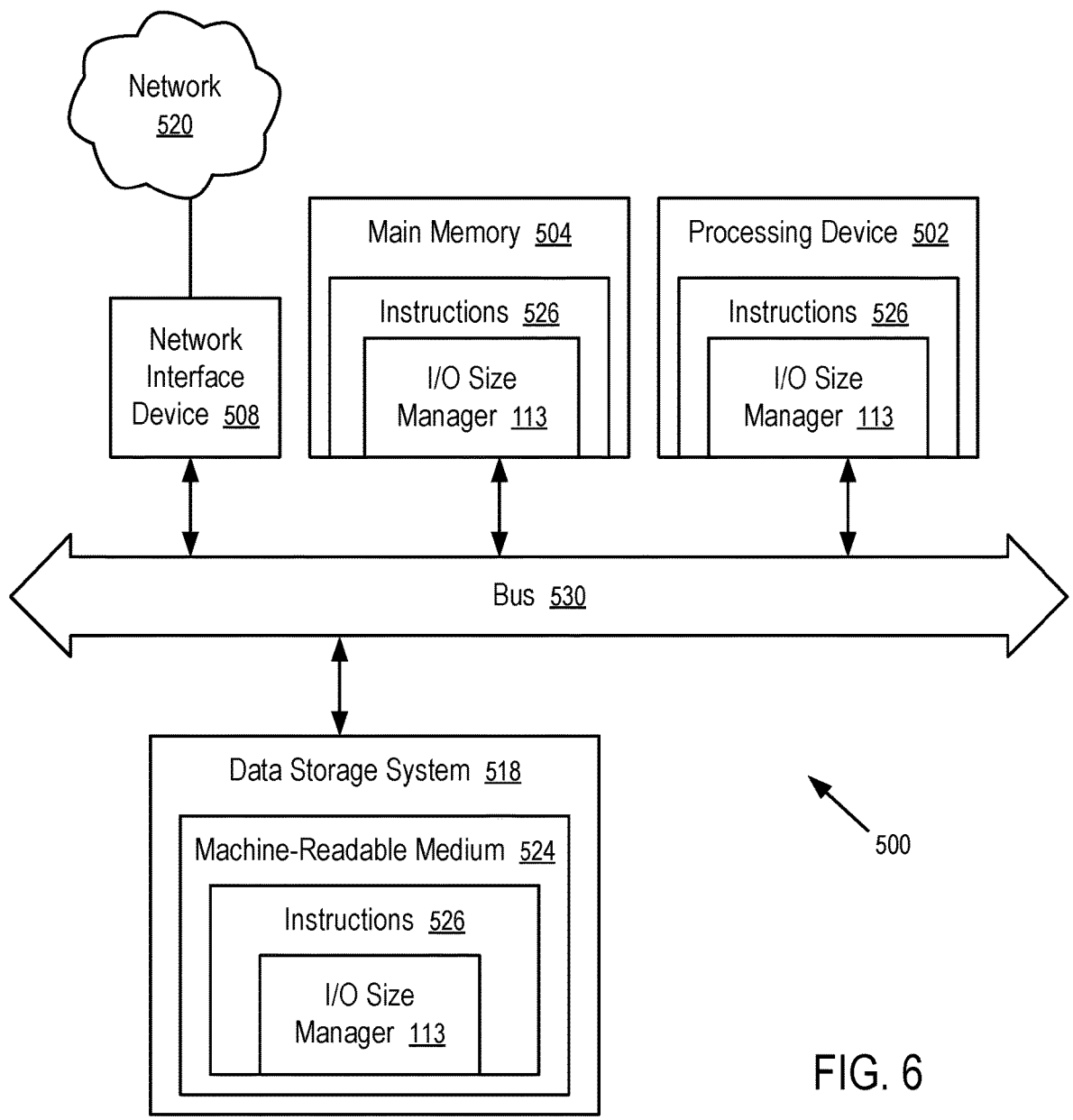
FIG. 6 is a block diagram of an example computer system in which embodiments of the present disclosure can operate.

FIG. 6 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of an input/output size manager 113 (e.g., to execute instructions to perform operations corresponding to the input/output size manager 113 described with reference to FIGS. 1-5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 518, which communicate with each other via a bus 530 (which can include multiple buses).

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to an input/output size manager 113 (e.g., the input/output size manager 113 described with reference to FIGS. 1-5). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:

receiving, in a memory sub-system, write commands from a host system;

identifying, based on a media physical layout, a first input/output size for a next write command from the host system;

transmitting, from the memory sub-system to the host system, a response that is configured to identify at least the first input/output size, wherein the host system is configured to generate the next write command based on the first input/output size identified in the response;

receiving, in the memory sub-system, the next write command that instructs the memory sub-system to write, into the memory sub-system, an amount of data that is configured according to the first input/output size; and generating and storing, dynamically in response to the write commands being selected for execution in media units of the memory sub-system, a portion of the media physical layout that maps from logical addresses identified by the write commands in a logical address space to physical addresses of memory units in the media units;

wherein the response is configured to include a status of a first write command processed in the memory sub-system.

2. The method of claim 1, further comprising:
determining that the first write command has a second input/output size different from the first input/output size, wherein the response is configured to indicate that the second input/output size is incorrect.

3. The method of claim 2, wherein the next write command is transmitted from the host system to the memory sub-system to replace the first write command.

4. The method of claim 1, wherein the first input/output size is determined, based on the media physical layout, to be a size of data that is writable into one of the media units in an atomic write operation.

5. The method of claim 1, wherein the first input/output size is determined, to be a smallest size of next available memory pages, each of which is writable, based on the media physical layout, in one of the media units in an atomic write operation.

6. The method of claim 5, wherein the smallest size is based on a mode of programming data in a next available memory page that is atomically programmable in one of the media units.

7. The method of claim 6, wherein the mode is one of a plurality of modes supported in the memory sub-system; and the plurality of modes include:
a single level cell (SLC) mode;
a multi-level cell (MLC) mode;
a triple level cell (TLC) mode; and
a quad-level cell (QLC) mode.

8. The method of claim 7, wherein the next available memory page is a NAND flash memory page programmable via a multi-pass programming technique.

9. The method of claim 8, wherein the NAND flash memory page includes a plurality of planes of NAND memory cells.

10. The method of claim 9, wherein the portion of the media physical layout includes mapping between logical block addressing (LBA) addresses in a namespace and blocks of NAND memory in separate integrated circuit dies; and the input/output size is determined based on an entry of a page map that identifies a mode of the next available page in a block of NAND memory cells.

11. A non-transitory computer storage medium storing instructions which, when executed in a memory sub-system, causes the memory sub-system to perform a method, the method comprising:
receiving, in the memory sub-system, write commands from a host system;
identifying, based on a media physical layout, a first input/output size for a next write command from the host system;
transmitting, from the memory sub-system to the host system, a response that is configured to identify at least the first input/output size, wherein the host system is configured to generate the next write command based on the first input/output size identified in the response; and
receiving, in the memory sub-system, the next write command that instructs the memory sub-system to write, into the memory sub-system, an amount of data that is configured according to the first input/output size determined, to be a smallest size of next available memory pages, each of which is writable, based on the media physical layout, in one of the media units in an atomic write operation, wherein the smallest size is based on a mode of programming data in a next available page that is atomically programmable in one of the media units; and the mode is one of a plurality of modes supported in the memory sub-system.

12. The non-transitory computer storage medium of claim 11, wherein the method further comprises:
generating and storing, dynamically in response to the write commands being selected for execution in media units of the memory sub-system, a portion of the media physical layout that maps from logical addresses identified by the write commands in a logical address space to physical addresses of memory units in the media units;
wherein the logical address space is defined in a namespace of the memory sub-system; the namespace is configured with a plurality of zones; and the write commands are configured to write concurrently in the plurality of zones.

13. The non-transitory computer storage medium of claim 11, wherein the response is configured to include a status of a first write command processed in the memory sub-system.

14. The non-transitory computer storage medium of claim 11, wherein the plurality of modes include:
a single level cell (SLC) mode;
a multi-level cell (MLC) mode;
a triple level cell (TLC) mode; and
a quad-level cell (QLC) mode.

15. A memory sub-system, comprising:
a plurality of media units capable of writing data concurrently; and
at least one processing device configured to:
receive, in the memory sub-system, a first write command from a host system;
identify, based on a media physical layout, a first input/output size for a second write command from the host system;
transmit, from the memory sub-system to the host system, a response to the first write command, wherein the response is configured to identify at least the first input/output size, and wherein the host system is configured to generate the second write command based on the first input/output size identified in the response; and
receive, in the memory sub-system, the second write command that instructs the memory sub-system to write, into the memory sub-system, an amount of data that is configured according to the first input/output size; wherein the response is configured to include a status of the first write command processed in the memory sub-system; and
wherein the processing device is further configured to:
generate and store, dynamically in response to the first write command being selected for execution in media units of the memory sub-system, a portion of the media physical layout that maps from a logical address identified by the first write command in a logical address space to a physical address of memory units in the media units;
determine that the first write command has a second input/output size different from the first input/output size; and
configure the response to indicate that the second input/output size is incorrect.

16. The memory sub-system of claim 15, wherein the first input/output size is determined, based on the media physical layout, to be a size of data that is writable into one of the media units in an atomic write operation.

17. The memory sub-system of claim 15, wherein the first input/output size is determined, to be a smallest size of next available memory pages, each of which is writable, based on the media physical layout, in one of the media units in an atomic write operation.

18. The memory sub-system of claim 17, wherein the smallest size is based on a mode of programming data in a next available page that is atomically programmable in one of the media units; the mode is one of a plurality of modes supported in the memory sub-system; and the plurality of modes include:
   a single level cell (SLC) mode;
   a multi-level cell (MLC) mode;
   a triple level cell (TLC) mode; and
   a quad-level cell (QLC) mode.

19. The memory sub-system of claim 17, wherein a next available page is a NAND flash memory page programmable via a multi-pass programming technique; and the NAND flash memory page includes a plurality of planes of NAND memory cells.

20. The memory sub-system of claim 19, wherein the portion of the media physical layout includes mapping between logical block addressing (LBA) addresses in a namespace and blocks of NAND memory in separate integrated circuit dies; and the first input/output size is determined based on an entry of a page map that identifies a mode of the next available page in a block of NAND memory cells.

* * * * *